United States Patent
Costa et al.

(10) Patent No.: US 10,037,929 B2
(45) Date of Patent: Jul. 31, 2018

(54) THERMALLY ENHANCED SEMICONDUCTOR PACKAGE HAVING FIELD EFFECT TRANSISTORS WITH BACK-GATE FEATURE

(71) Applicant: Qorvo US, Inc., Greensboro, NC (US)

(72) Inventors: Julio C. Costa, Oak Ridge, NC (US); George Maxim, Saratoga, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/652,867

(22) Filed: Jul. 18, 2017

(65) Prior Publication Data

US 2018/0019185 A1    Jan. 18, 2018

Related U.S. Application Data

(60) Provisional application No. 62/363,499, filed on Jul. 18, 2016.

(51) Int. Cl.
*H01L 21/762* (2006.01)
*H01L 29/423* (2006.01)
(Continued)

(52) U.S. Cl.
CPC ........ *H01L 23/3737* (2013.01); *H01L 23/535* (2013.01); *H01L 29/0653* (2013.01);
(Continued)

(58) Field of Classification Search
CPC ................... H01L 21/76283; H01L 29/42356
(Continued)

(56) References Cited

U.S. PATENT DOCUMENTS

| 4,093,562 A | 6/1978 | Kishimoto |
| 4,366,202 A | 12/1982 | Borovsky |

(Continued)

FOREIGN PATENT DOCUMENTS

| CN | 103811474 A | 5/2014 |
| EP | 2996143 A1 | 3/2016 |

(Continued)

OTHER PUBLICATIONS

Non-Final Office Action for U.S. Appl. No. 15/229,780, dated Jun. 30, 2017, 12 pages.

(Continued)

*Primary Examiner* — George Fourson, III
(74) *Attorney, Agent, or Firm* — Withrow & Terranova, P.L.L.C.

(57) ABSTRACT

The present disclosure relates to a thermally enhanced semiconductor package having field effect transistors (FETs) with a back-gate feature. The thermally enhanced semiconductor package includes a non-silicon thermal conductive component, a silicon layer with a thickness between 100 Å and 10 μm over the thermal conductive component, a buried oxide (BOX) layer over the silicon layer, an epitaxial layer over the BOX layer and having a source, a drain, and a channel between the source and the drain, a gate dielectric aligned over the channel, and a front-gate structure over the gate dielectric. Herein, a back-gate structure is formed in the silicon layer and has a back-gate region aligned below the channel. A FET is formed by the front-gate structure, the source, the drain, the channel, and the back-gate structure.

20 Claims, 11 Drawing Sheets

Figure 1A:
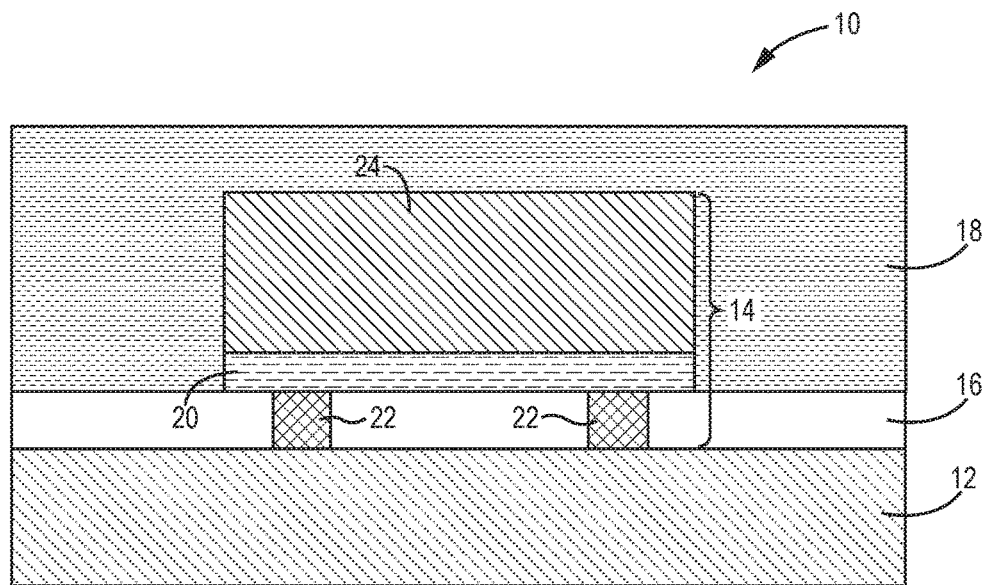

(51) Int. Cl.
*H01L 23/373* (2006.01)
*H01L 29/786* (2006.01)
*H01L 29/06* (2006.01)
*H01L 23/535* (2006.01)
H01L 23/00 (2006.01)
H01L 23/498 (2006.01)
H01L 23/31 (2006.01)

(52) U.S. Cl.
CPC .. *H01L 29/78648* (2013.01); *H01L 29/78651* (2013.01); *H01L 29/78696* (2013.01); H01L 21/76283 (2013.01); H01L 23/3114 (2013.01); H01L 23/498 (2013.01); H01L 24/16 (2013.01); H01L 29/42356 (2013.01)

(58) Field of Classification Search
USPC .......................................................... 257/366
See application file for complete search history.

(56) References Cited

U.S. PATENT DOCUMENTS

| | | | |
|---|---|---|---|
| 5,061,663 A | 10/1991 | Bolt et al. | |
| 5,069,626 A | 12/1991 | Patterson et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A | 11/2000 | Ma et al. | |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 | 8/2001 | Ma et al. | |
| 6,423,570 B1 | 7/2002 | Ma et al. | |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,713,859 B1 | 3/2004 | Ma | |
| 6,841,413 B2 | 1/2005 | Liu et al. | |
| 6,864,156 B1 | 3/2005 | Conn | |
| 6,902,950 B2 | 6/2005 | Ma et al. | |
| 6,943,429 B1 | 9/2005 | Glenn et al. | |
| 6,964,889 B2 | 11/2005 | Ma et al. | |
| 6,992,400 B2 | 1/2006 | Tikka et al. | |
| 7,042,072 B1 | 5/2006 | Kim et al. | |
| 7,049,692 B2 | 5/2006 | Nishimura et al. | |
| 7,109,635 B1 | 9/2006 | McClure et al. | |
| 7,183,172 B2 | 2/2007 | Lee et al. | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 | 7/2010 | Kweon et al. | |
| 7,790,543 B2 | 9/2010 | Abadeer et al. | |
| 7,855,101 B2 | 12/2010 | Furman et al. | |
| 7,868,419 B1 | 1/2011 | Kerr et al. | |
| 7,960,218 B2 | 6/2011 | Ma et al. | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,816,407 B2 | 8/2014 | Kim et al. | |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 9,165,793 B1 | 10/2015 | Wang et al. | |
| 9,368,429 B2 | 6/2016 | Ma et al. | |
| 9,461,001 B1 | 10/2016 | Tsai et al. | |
| 9,646,856 B2 | 5/2017 | Meyer et al. | |
| 9,859,254 B1 | 1/2018 | Yu et al. | |
| 9,941,245 B2 | 4/2018 | Skeete et al. | |
| 2001/0004131 A1 | 6/2001 | Masayuki et al. | |
| 2002/0070443 A1 | 6/2002 | Mu et al. | |
| 2002/0074641 A1 | 6/2002 | Towle et al. | |
| 2002/0127769 A1 | 9/2002 | Ma et al. | |
| 2002/0127780 A1 | 9/2002 | Ma et al. | |
| 2002/0137263 A1 | 9/2002 | Towle et al. | |
| 2002/0185675 A1 | 12/2002 | Furukawa | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |
| 2006/0057782 A1 | 3/2006 | Gardes et al. | |
| 2006/0108585 A1 | 5/2006 | Gan et al. | |
| 2006/0261446 A1 | 11/2006 | Wood et al. | |
| 2007/0020807 A1 | 1/2007 | Geefay et al. | |
| 2007/0069393 A1 | 3/2007 | Asahi et al. | |
| 2007/0075317 A1 | 4/2007 | Kato et al. | |
| 2007/0121326 A1 | 5/2007 | Nall et al. | |
| 2007/0158746 A1 | 7/2007 | Ohguro | |
| 2007/0181992 A1 | 8/2007 | Lake | |
| 2007/0190747 A1 | 8/2007 | Humpston et al. | |
| 2007/0252481 A1 | 11/2007 | Iwamoto et al. | |
| 2007/0276092 A1 | 11/2007 | Kanae et al. | |
| 2008/0050852 A1 | 2/2008 | Hwang et al. | |
| 2008/0050901 A1 | 2/2008 | Kweon et al. | |
| 2008/0164528 A1* | 7/2008 | Cohen | H01L 21/28518 257/365 |
| 2008/0272497 A1 | 11/2008 | Lake | |
| 2008/0315372 A1 | 12/2008 | Kuan et al. | |
| 2009/0008714 A1 | 1/2009 | Chae | |
| 2009/0010056 A1 | 1/2009 | Kuo et al. | |
| 2009/0014856 A1 | 1/2009 | Knickerbocker | |
| 2009/0179266 A1 | 7/2009 | Abadeer et al. | |
| 2009/0261460 A1 | 10/2009 | Kuan et al. | |
| 2010/0012354 A1 | 1/2010 | Hedin et al. | |
| 2010/0029045 A1 | 2/2010 | Ramanathan et al. | |
| 2010/0045145 A1 | 2/2010 | Tsuda | |
| 2010/0081232 A1 | 4/2010 | Furman et al. | |
| 2010/0081237 A1 | 4/2010 | Wong et al. | |
| 2010/0109122 A1 | 5/2010 | Ding et al. | |
| 2010/0127340 A1 | 5/2010 | Sugizaki | |
| 2010/0173436 A1 | 7/2010 | Ouellet et al. | |
| 2010/0200919 A1* | 8/2010 | Kikuchi | H01L 21/823814 257/351 |
| 2011/0003433 A1 | 1/2011 | Harayama et al. | |
| 2011/0026232 A1 | 2/2011 | Lin et al. | |
| 2011/0036400 A1 | 2/2011 | Murphy et al. | |
| 2011/0062549 A1 | 3/2011 | Lin | |
| 2011/0068433 A1 | 3/2011 | Kim et al. | |
| 2011/0102002 A1 | 5/2011 | Riehl et al. | |
| 2011/0171792 A1 | 7/2011 | Chang et al. | |
| 2011/0272800 A1 | 11/2011 | Chino | |
| 2011/0272824 A1 | 11/2011 | Pagaila | |
| 2011/0294244 A1 | 12/2011 | Hattori et al. | |
| 2012/0003813 A1 | 1/2012 | Chuang et al. | |
| 2012/0068276 A1 | 3/2012 | Lin et al. | |
| 2012/0094418 A1 | 4/2012 | Grama et al. | |
| 2012/0104495 A1* | 5/2012 | Zhu | H01L 21/84 257/347 |
| 2012/0119346 A1 | 5/2012 | Im et al. | |
| 2012/0153393 A1* | 6/2012 | Liang | H01L 21/8213 257/347 |

(56) References Cited

U.S. PATENT DOCUMENTS

| | | | |
|---|---|---|---|
| 2012/0168863 A1* | 7/2012 | Zhu | H01L 21/84 257/347 |
| 2012/0256260 A1* | 10/2012 | Cheng | H01L 21/26506 257/347 |
| 2012/0292700 A1* | 11/2012 | Khakifirooz | H01L 21/84 257/347 |
| 2012/0299105 A1* | 11/2012 | Cai | H01L 27/1203 257/348 |
| 2013/0001665 A1* | 1/2013 | Zhu | H01L 21/2652 257/314 |
| 2013/0015429 A1 | 1/2013 | Hong et al. | |
| 2013/0049205 A1 | 2/2013 | Meyer et al. | |
| 2013/0099315 A1* | 4/2013 | Zhu | H01L 29/66742 257/347 |
| 2013/0105966 A1 | 5/2013 | Kelkar et al. | |
| 2013/0147009 A1 | 6/2013 | Kim | |
| 2013/0155681 A1 | 6/2013 | Nall et al. | |
| 2013/0196483 A1 | 8/2013 | Dennard et al. | |
| 2013/0200456 A1* | 8/2013 | Zhu | H01L 21/762 257/347 |
| 2013/0280826 A1 | 10/2013 | Scanlan et al. | |
| 2013/0299871 A1 | 11/2013 | Mauder et al. | |
| 2014/0035129 A1 | 2/2014 | Stuber et al. | |
| 2014/0134803 A1 | 5/2014 | Kelly et al. | |
| 2014/0168014 A1 | 6/2014 | Chih et al. | |
| 2014/0197530 A1 | 7/2014 | Meyer et al. | |
| 2014/0210314 A1 | 7/2014 | Bhattacharjee et al. | |
| 2014/0252566 A1 | 9/2014 | Kerr et al. | |
| 2014/0252567 A1 | 9/2014 | Carroll et al. | |
| 2014/0264813 A1 | 9/2014 | Lin et al. | |
| 2014/0264818 A1 | 9/2014 | Lowe, Jr. et al. | |
| 2014/0306324 A1 | 10/2014 | Costa et al. | |
| 2014/0327003 A1 | 11/2014 | Fuergut et al. | |
| 2014/0327150 A1 | 11/2014 | Jung et al. | |
| 2014/0346573 A1 | 11/2014 | Adam et al. | |
| 2015/0115416 A1 | 4/2015 | Costa et al. | |
| 2015/0130045 A1 | 5/2015 | Tseng et al. | |
| 2015/0235990 A1 | 8/2015 | Cheng et al. | |
| 2015/0235993 A1 | 8/2015 | Cheng et al. | |
| 2015/0243881 A1 | 8/2015 | Sankman et al. | |
| 2015/0255368 A1 | 9/2015 | Costa | |
| 2015/0262844 A1 | 9/2015 | Meyer et al. | |
| 2015/0279789 A1 | 10/2015 | Mahajan et al. | |
| 2015/0311132 A1 | 10/2015 | Kuo et al. | |
| 2015/0364344 A1 | 12/2015 | Yu et al. | |
| 2015/0380523 A1 | 12/2015 | Hekmatshoartabari et al. | |
| 2016/0002510 A1 | 1/2016 | Champagne et al. | |
| 2016/0079137 A1 | 3/2016 | Leipold et al. | |
| 2016/0093580 A1 | 3/2016 | Scanlan et al. | |
| 2016/0155706 A1 | 6/2016 | Yoneyama et al. | |
| 2016/0284568 A1 | 9/2016 | Morris et al. | |
| 2016/0343592 A1 | 11/2016 | Costa et al. | |
| 2016/0343604 A1 | 11/2016 | Costa et al. | |
| 2017/0190572 A1 | 7/2017 | Pan et al. | |

FOREIGN PATENT DOCUMENTS

| | | |
|---|---|---|
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Non-Final Office Action for U.S. Appl. No. 15/262,457, dated Aug. 7, 2017, 10 pages.
Non-Final Office Action for U.S. Appl. No. 15/353,346, dated May 23, 2017, 15 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Non-Final Office Action for U.S. Appl. No. 14/715,830, dated Apr. 13, 2016, 16 pages.
Extended European Search Report for European Patent Application No. 15184861.1, dated Jan. 25, 2016, 6 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
Final Office Action for U.S. Appl. No. 13/852,648, dated Jul. 20, 2016, 14 pages.
Notice of Allowance for U.S. Appl. No. 14/529,870, dated Jul. 15, 2016, 8 pages.
Office Action of the Intellectual Property Office for Taiwanese Patent Application No. 104130224, dated Jun. 15, 2016, 9 pages.
Author Unknown, "Fully Sintered Ferrite Powders," Powder Processing and Technology, LLC, Date Unknown, 1 page.
Author Unknown, "Hysol UF3808," Henkel Corporation, Technical Data Sheet, May 2013, 2 pages.

(56) References Cited

OTHER PUBLICATIONS

Final Office Action for U.S. Appl. No. 14/715,830, dated Sep. 6, 2016, 13 pages.
Advisory Action for U.S. Appl. No. 14/715,830, dated Oct. 31, 2016, 6 pages.
Non-Final Office Action for U.S. Appl. No. 14/851,652, dated Oct. 7, 2016, 10 pages.
Notice of Allowance for U.S. Appl. No. 14/959,129, dated Oct. 11, 2016, 8 pages.
International Search Report and Written Opinion for PCT/US2016/045809, dated Oct. 7, 2016, 11 pages.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Micak, R. et al. "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.

Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Heat Transfer," Cool Polymers, Inc., 2006, http://www.coolpolymers.com/heattrans.html, 2 pages.
Author Unknown, "Plastics that Conduct Heat," Plastics Technology Online, Jun. 2001, Retrieved Jun. 24, 2013, http://www.ptonline.com/articles/plastics-that-conduct-heat, 4 pages.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.

(56) References Cited

OTHER PUBLICATIONS

Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, Jean-Pierre et al., "Substrate Crosstalk Reduction Using SOI Technology," IEEE Transactions on Electron Devices, vol. 44, No. 12, Dec. 1997, pp. 2252-2261.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Rong, B., et al., "Surface-Passivated High-Resistivity Silicon Substrates for RFICs," IEEE Electron Device Letters, vol. 25, No. 4, Apr. 2004, pp. 176-178.
Tombak, A., et al., "High-Efficiency Cellular Power Amplifiers Based on a Modified LDMOS Process on Bulk Silicon and Silicon-on-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.

Bernheim et al., "Chapter 9: Lamination," Tools and Manufacturing Engineers Handbook (book), Apr. 1, 1996, Society of Manufacturing Engineers, p. 9-1.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Corrected Notice of Allowance for U.S. Appl. No. 14/851,652, dated Sep. 6, 2017, 5 pages.
Notice of Allowance for U.S. Appl. No. 15/229,780, dated Oct. 3, 2017, 7 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Notice of Allowance for U.S. Appl. No. 15/353,346, dated Sep. 25, 2017, 9 pages.
Supplemental Notice of Allowability for U.S. Appl. No. 15/287,273, dated Sep. 7, 2017, 5 pages.
International Preliminary Report on Patentability for PCT/US2016/045809, dated Feb. 22, 2018, 8 pages.
Non-Final Office Action for U.S. Appl. No. 15/795,915, dated Feb. 23, 2018, 6 pages.
Non-Final Office Action for U.S. Appl. No. 15/387,855, dated Jan. 16, 2018, 7 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Jan. 17, 2018, 5 pages.
Supplemental Notice of Allowability for U.S. Appl. No. 15/287,273, dated Feb. 23, 2018, 5 pages.
Notice of Allowance for U.S. Appl. No. 15/498,040, dated Feb. 20, 2018, 8 pages.
Non-Final Office Action for U.S. Appl. No. 15/491,064, dated Jan. 2, 2018, 9 pages.
Non-Final Office Action for U.S. Appl. No. 15/676,415, dated Mar. 27, 2018, 14 pages.
Non-Final Office Action for U.S. Appl. No. 15/676,621, dated Mar. 26, 2018, 16 pages.
Final Office Action for U.S. Appl. No. 15/616,109, dated Apr. 19, 2018, 18 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/676,693, dated May 3, 2018, 14 pages.

(56) References Cited

OTHER PUBLICATIONS

Notice of Allowance for U.S. Appl. No. 15/789,107, dated May 18, 2018, 8 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Notice of Allowance for U.S. Appl. No. 15/676,621, dated Jun. 5, 2018, 8 pages.

* cited by examiner

THERMALLY ENHANCED SEMICONDUCTOR PACKAGE HAVING FIELD EFFECT TRANSISTORS WITH BACK-GATE FEATURE

RELATED APPLICATIONS

This application claims the benefit of provisional patent application Ser. No. 62/363,499, filed Jul. 18, 2016. This application is related to concurrently filed U.S. patent application Ser. No. 15/652,826, entitled "THERMALLY ENHANCED SEMICONDUCTOR PACKAGE HAVING FIELD EFFECT TRANSISTORS WITH BACK-GATE FEATURE" the disclosures of which are hereby incorporated herein by reference in their entirety.

FIELD OF THE DISCLOSURE

The present disclosure relates to a semiconductor package having field effect transistors (FETs) and a process for making the same, and more particularly to a thermally enhanced semiconductor package having FETs with a back-gate feature, and a process to enhance thermal performance of the semiconductor package.

BACKGROUND

With the current popularity of portable communication devices and developed semiconductor fabrication technology, high speed and high performance transistors are more densely integrated on semiconductor dies. Consequently, the amount of heat generated by the semiconductor dies will increase significantly due to the large number of transistors integrated on the semiconductor dies, the large amount of power passing through the transistors, and the high operation speed of the transistors. Accordingly, it is desirable to package the semiconductor dies in a configuration for better heat dissipation.

The field effect transistor (FET) fabricated on silicon-on-insulator (SOI) substrate is widely used in communication applications because of its reliability, a large scale capacity of wafer production, and low cost. SOI technologies at 65 nm or below (45 nm, 22 nm, etc.) need to implement back-gate transistors to improve control over the channel and reduce leakage current.

To accommodate the increased heat generation of high performance dies and to utilize the advantages of FET on SOI, it is therefore an object of the present disclosure to provide an improved semiconductor package design with FETs in a configuration for better heat dissipation. In addition, there is also a need to implement back-gates for FETs to improve control over the channel and reduce leakage current.

SUMMARY

The present disclosure relates to a thermally enhanced semiconductor package having field effect transistors (FETs) with a back-gate feature, and a process for making the same. According to one embodiment, a thermally enhanced semiconductor package includes a non-silicon thermal conductive component, a silicon layer with a thickness between 100 Å and 10 μm over the thermal conductive component, a buried oxide (BOX) layer over the silicon layer, an epitaxial layer over the BOX layer, a gate dielectric over the epitaxial layer, and a front-gate structure formed over the gate dielectric. Herein, the epitaxial layer has a source, a drain, and a channel between the source and the drain. The gate dielectric and the front-gate structure are aligned over the channel. A back-gate structure is formed in the silicon layer and has a back-gate region aligned below the channel. A FET is formed by the front-gate structure, the source, the drain, the channel, and the back-gate structure.

According to another embodiment, the epitaxial layer further includes epitaxial isolation regions, which surround the source and the drain.

According to another embodiment, the silicon layer further includes silicon isolation regions, which surround the back-gate structure.

According to another embodiment, the thermally enhanced semiconductor package further includes a front-side back-gate contact coupled to the back-gate structure via a front-side interconnect. The front-side interconnect extends through the BOX layer and one of the epitaxial isolation regions of the epitaxial layer, where the one of the epitaxial isolation regions is adjacent to the drain or the source.

According to another embodiment, the back-gate structure further includes back-gate extensions that surround the back-gate region. The front-side interconnect is in contact with one of the back-gate extensions.

According to another embodiment, the back-gate region has a higher implant density than the back-gate extensions.

According to another embodiment, the thermally enhanced semiconductor package further includes a back-side back-gate contact coupled to the back-gate structure via a back-side interconnect. The back-side interconnect extends through the thermal conductive component.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A-1E provide exemplary steps that illustrate a process to fabricate an exemplary thermally enhanced semiconductor package.

Figure 1B:
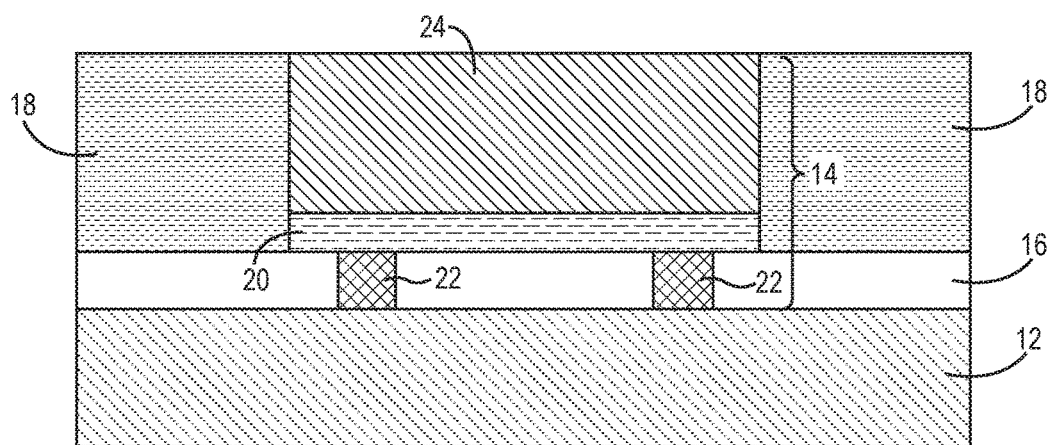
Figure 1C:
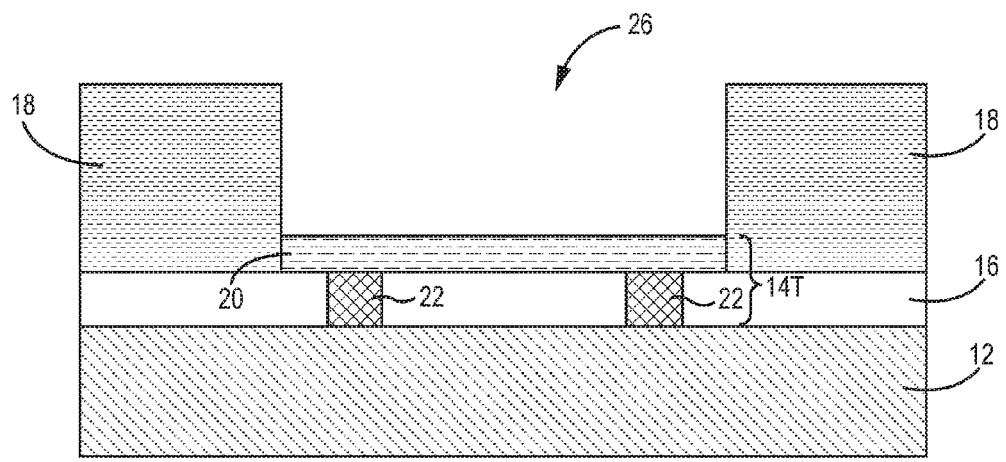
Figure 1D:
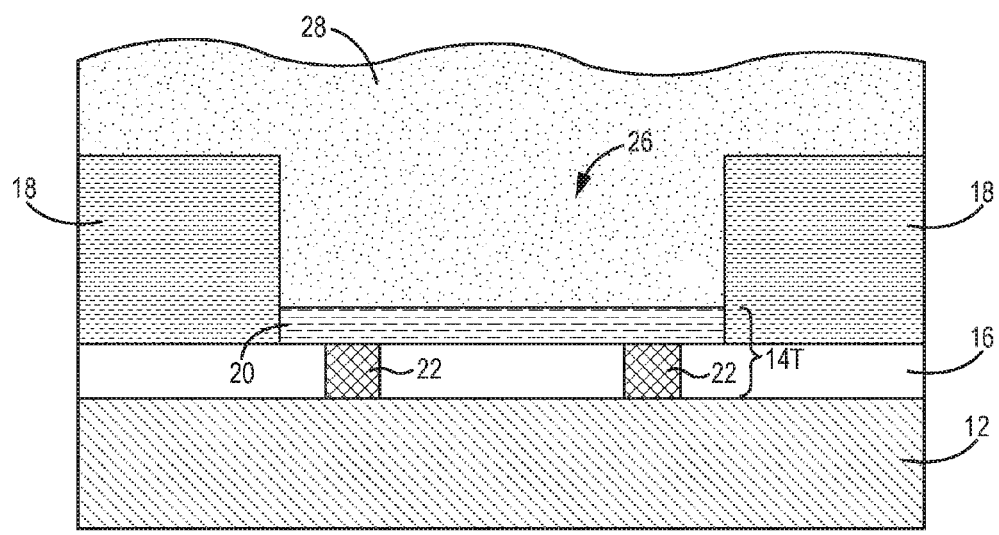
Figure 1E:
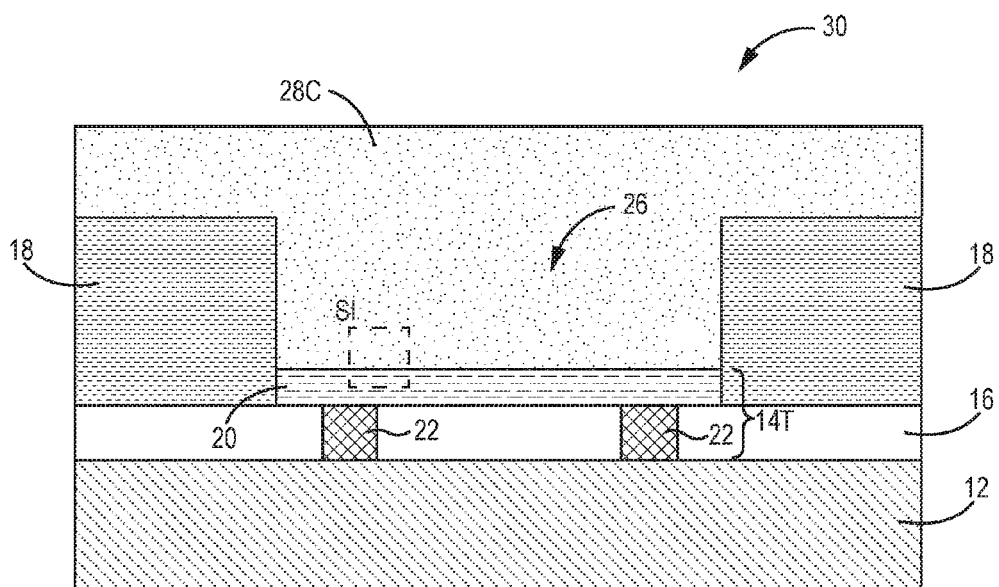
Figure 2:
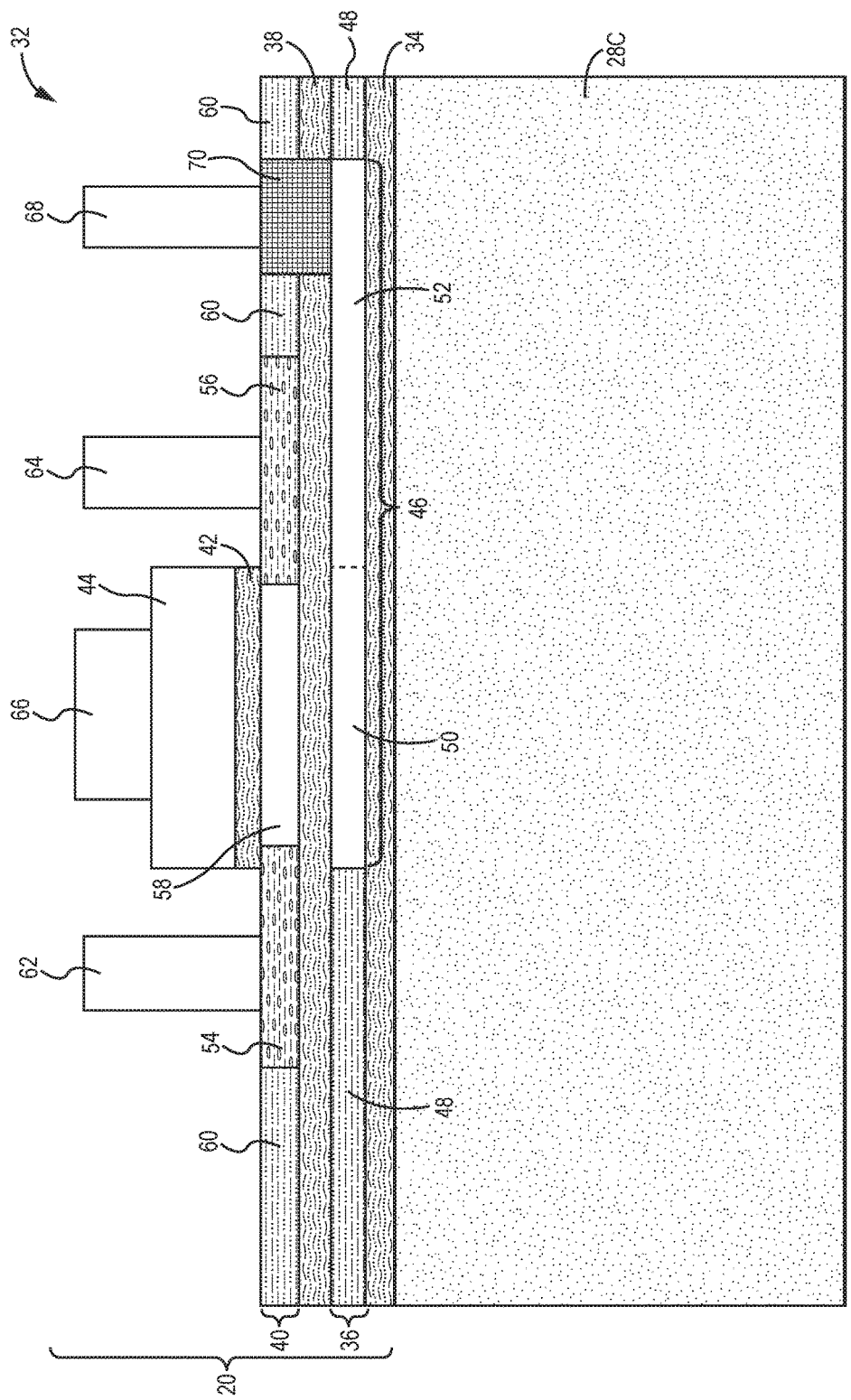

FIG. 2 provides an exemplary field effect transistor (FET) included in the exemplary thermally enhanced semiconductor package shown in FIG. 1E.

Figure 3:
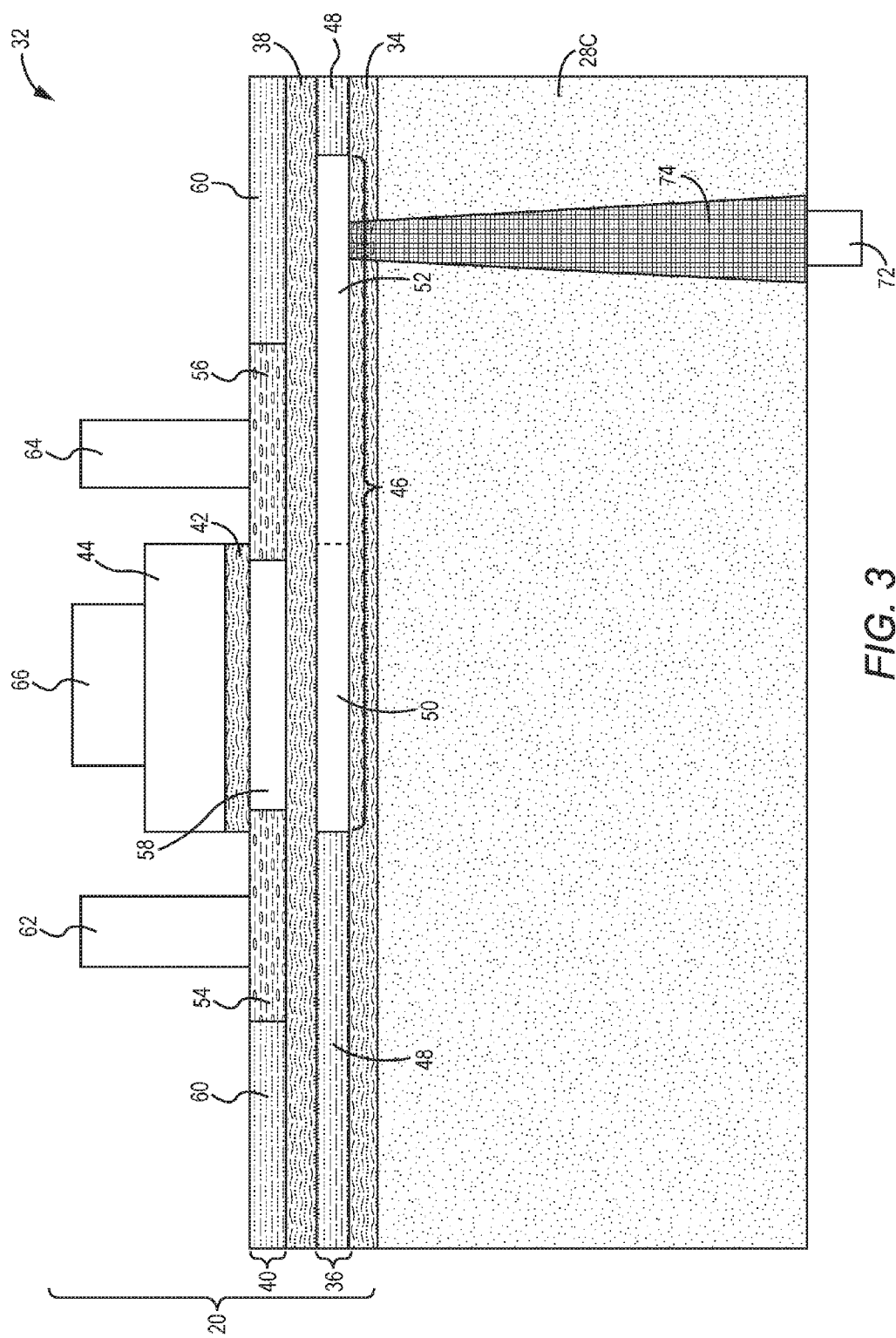

FIG. 3 provides an alternative FET included in the exemplary thermally enhanced semiconductor package shown in FIG. 1E.

FIGS. 4A-4E provide exemplary steps that illustrate a process to fabricate an alternative thermally enhanced semiconductor package.

Figure 4A:
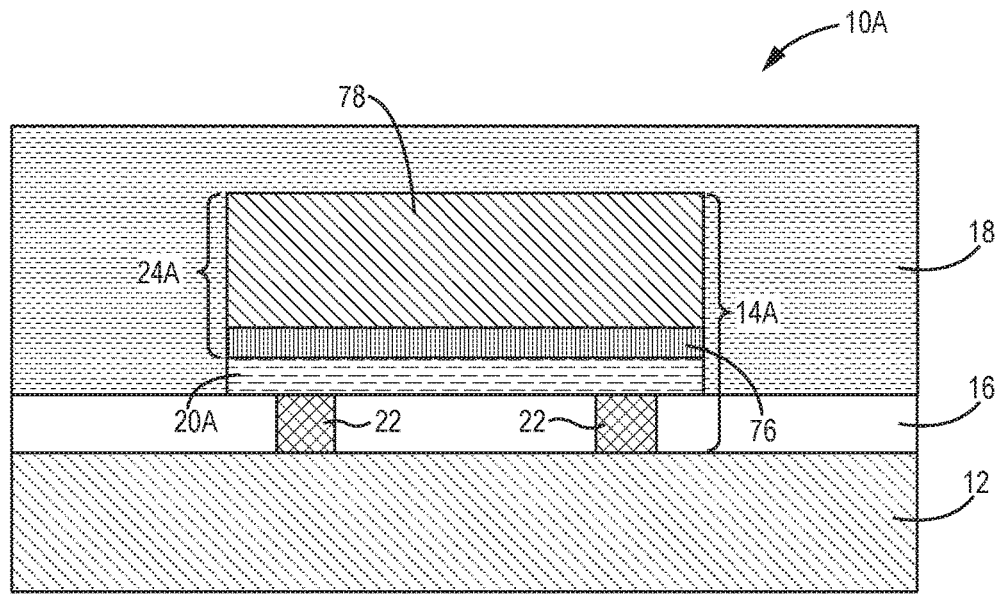
Figure 4B:
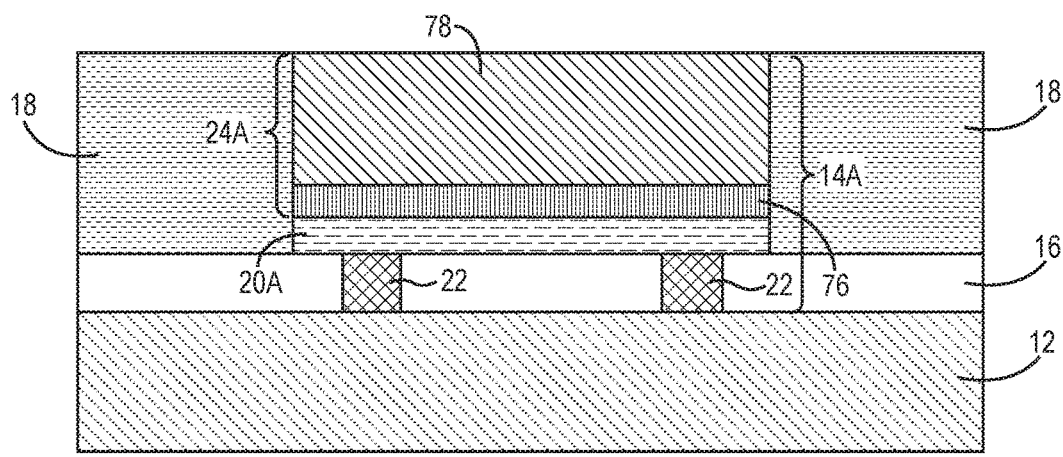
Figure 4C:
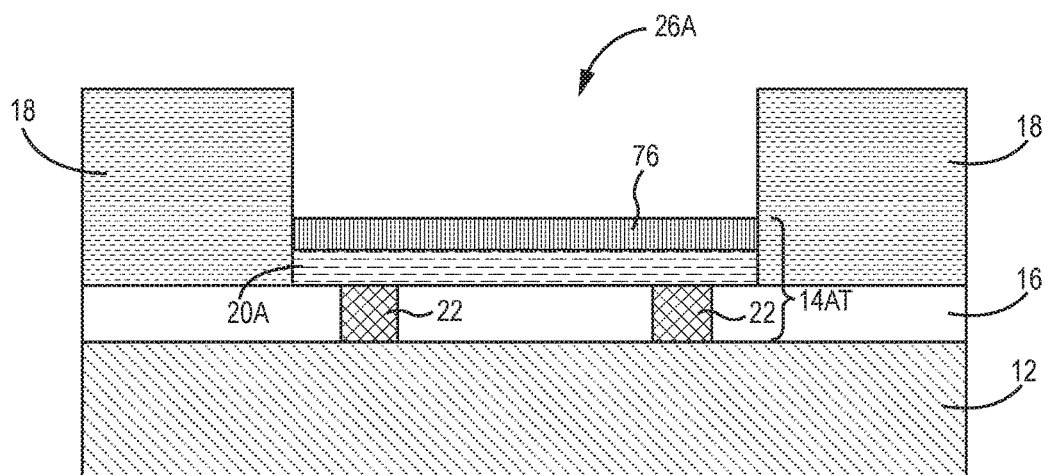
Figure 4D:
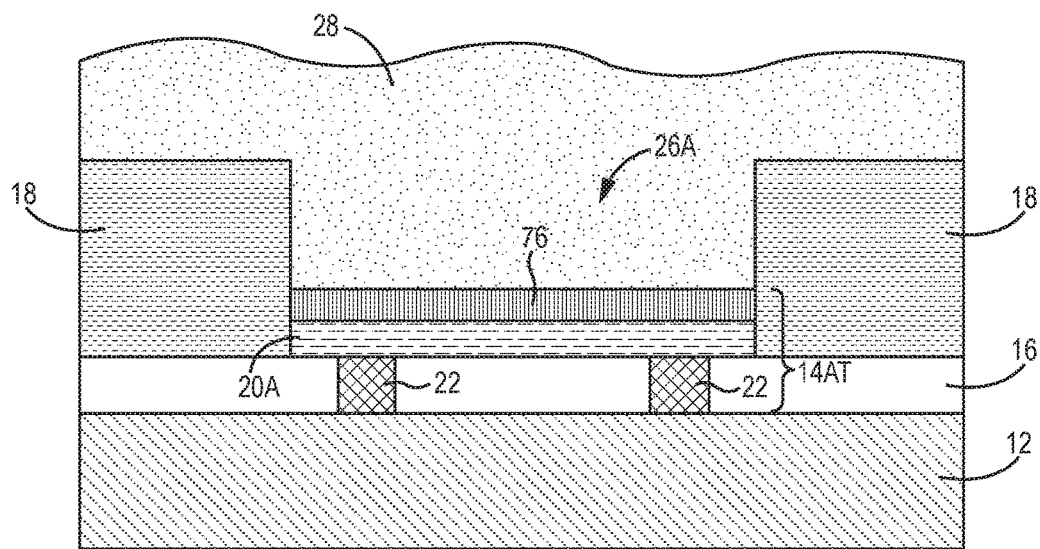
Figure 4E:
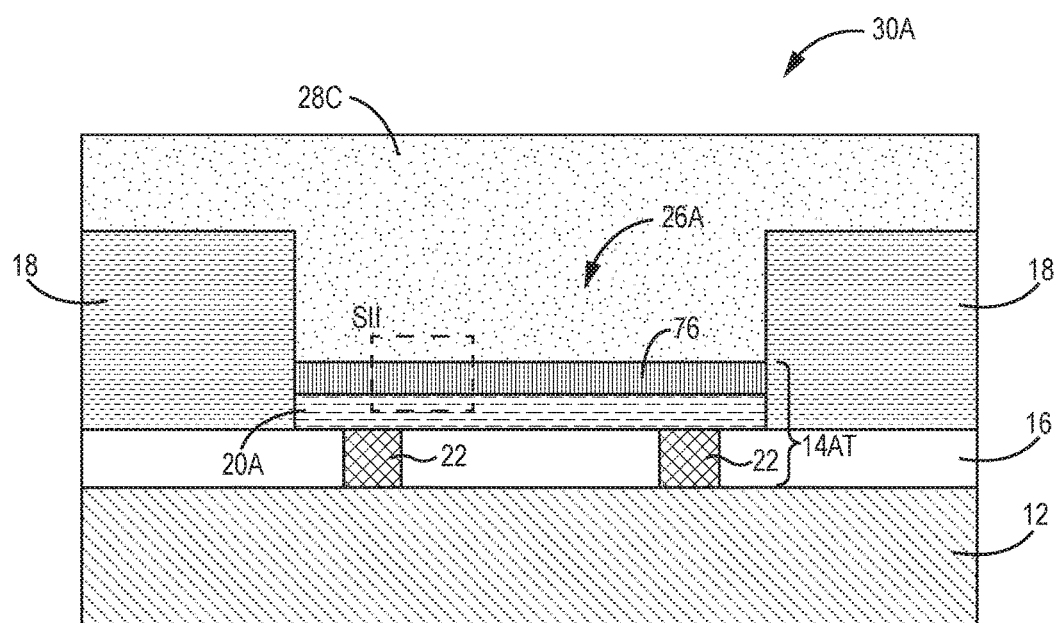
Figure 5:
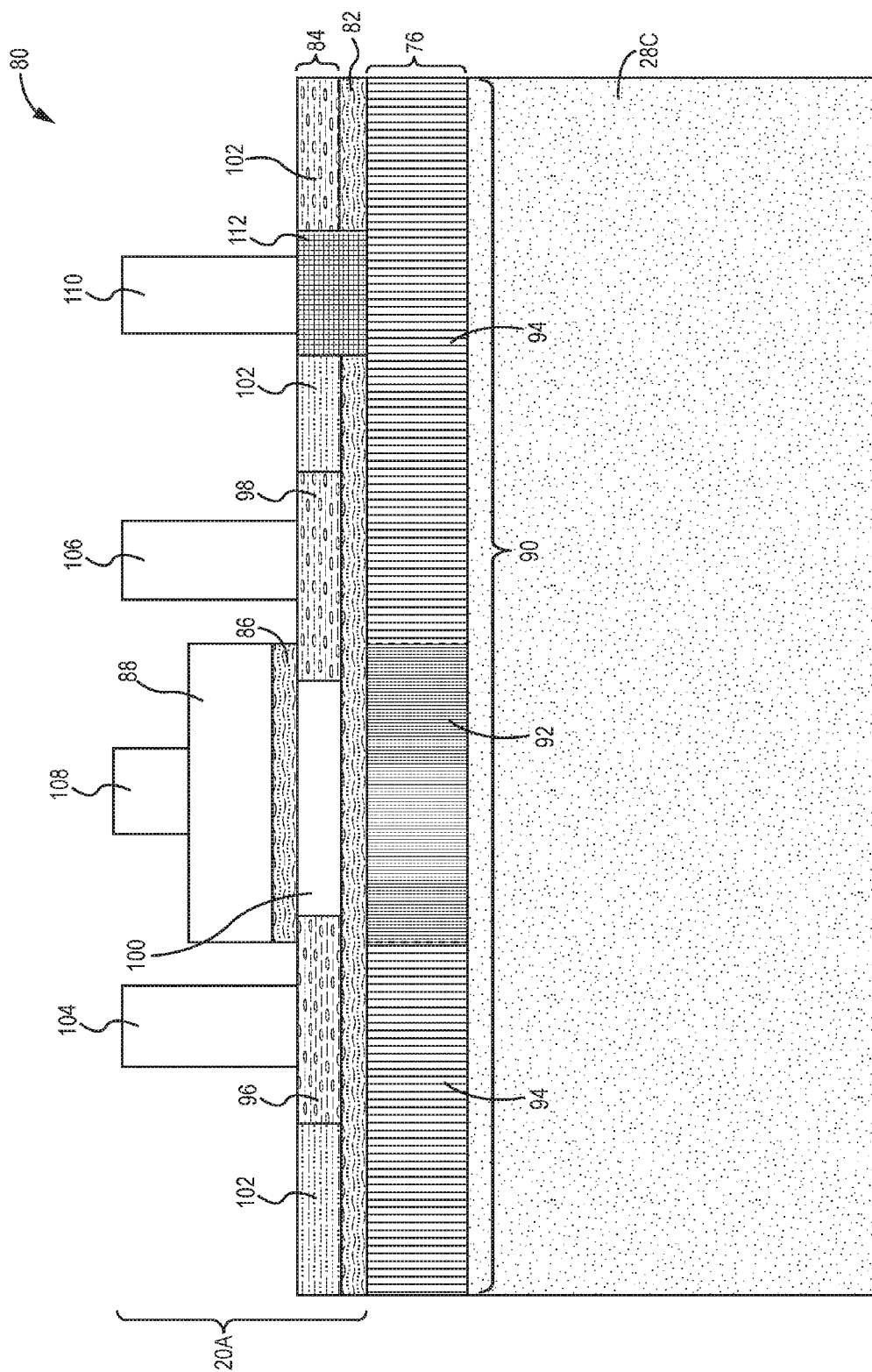

FIG. 5 provides an exemplary FET included in the alternative thermally enhanced semiconductor package shown in FIG. 4E.

Figure 6:
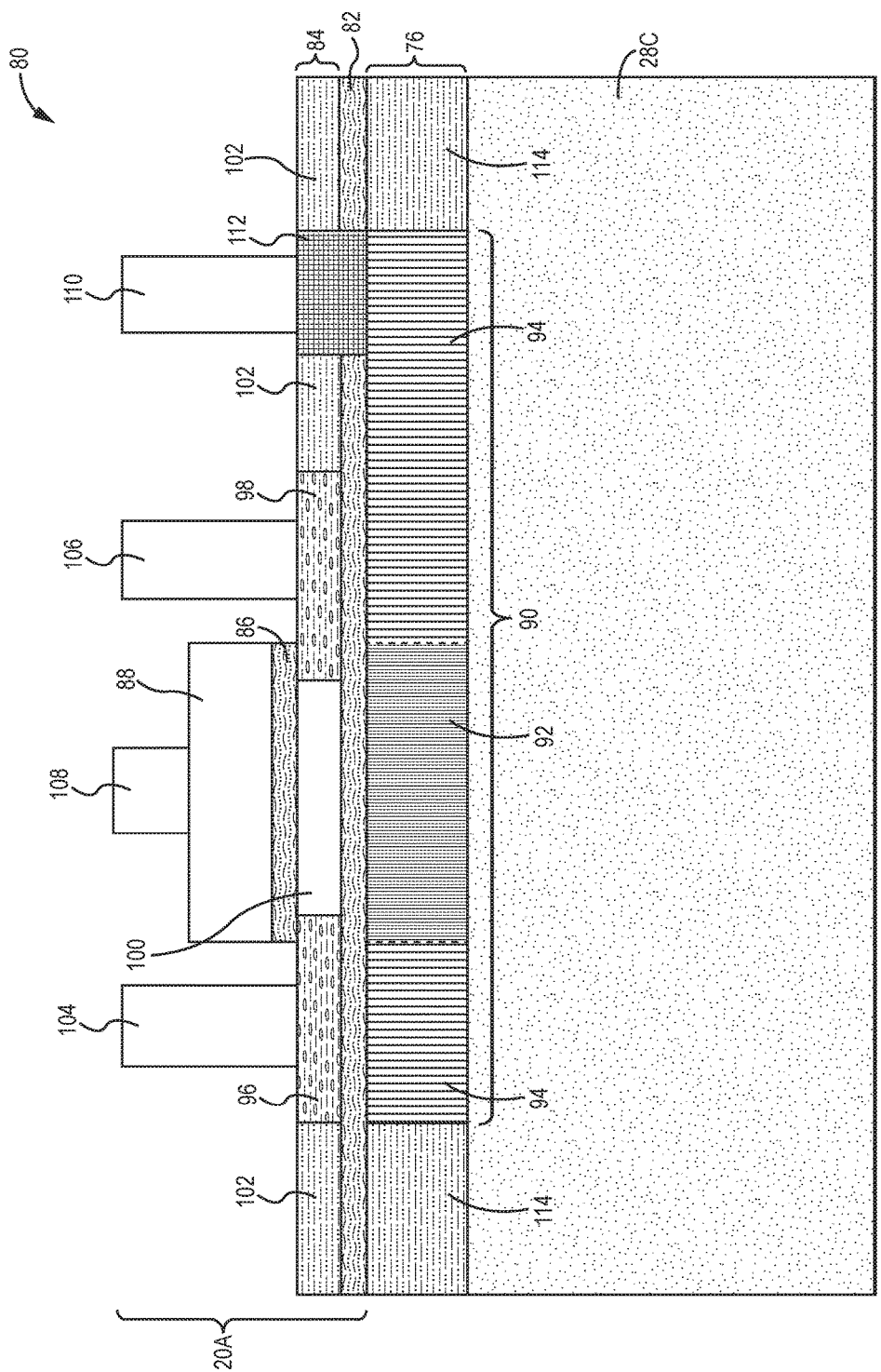

FIG. 6 provides an alternative FET included in the alternative thermally enhanced semiconductor package shown in FIG. 4E.

Figure 7:
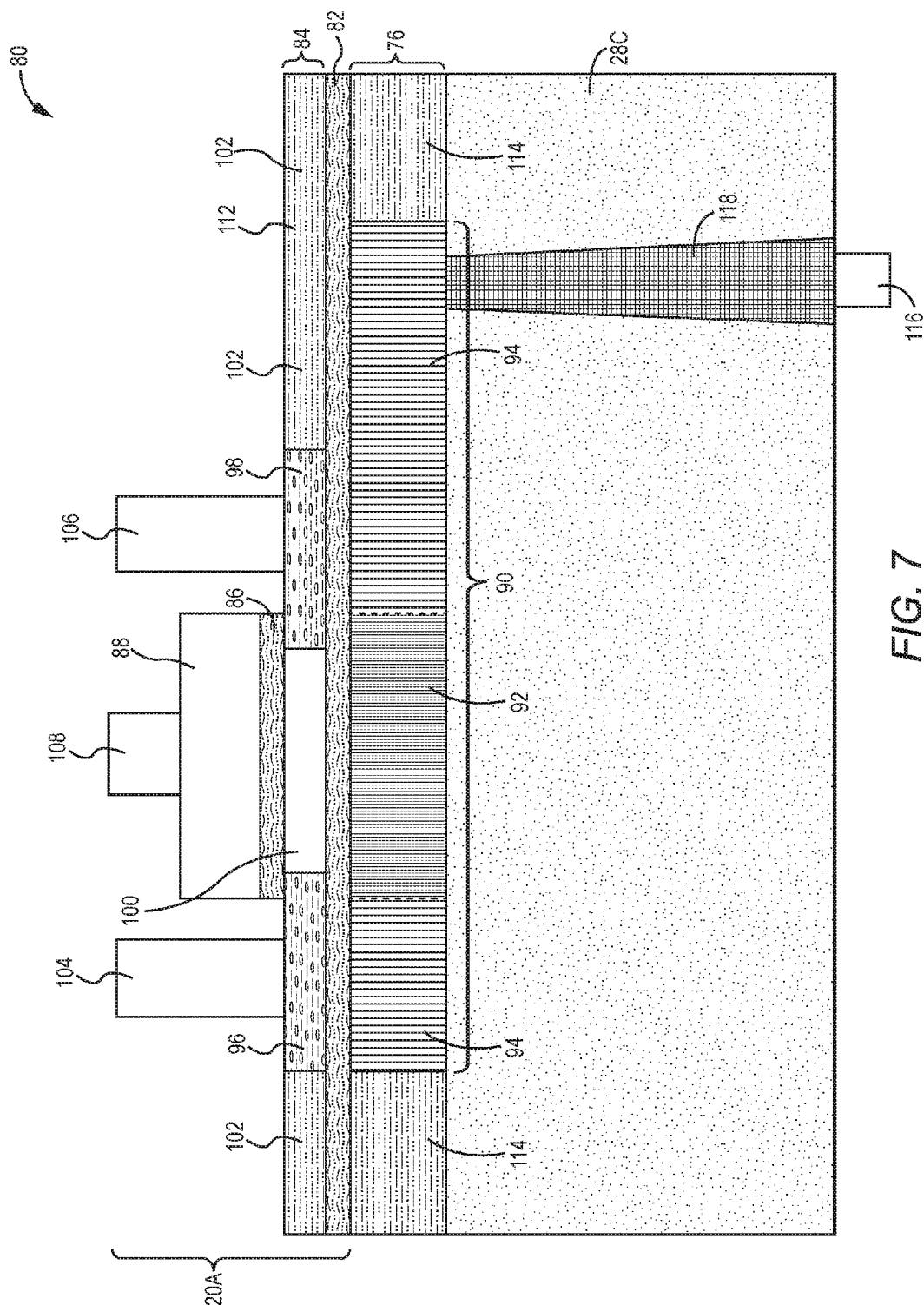

FIG. 7 provides an alternative FET included in the alternative thermally enhanced semiconductor package shown in FIG. 4E.

It will be understood that for clear illustrations, FIG. 1A-FIG. 7 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a thermally enhanced semiconductor package having field effect transistors (FETs) with a back-gate feature, and a process for making the same. FIGS. 1A-1E provide exemplary steps that illustrate a process to fabricate an exemplary thermally enhanced semiconductor package. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 1A-1E.

Initially, a semiconductor package 10 is provided as depicted in FIG. 1A. For the purpose of this illustration, the semiconductor package 10 includes a module substrate 12, a flip chip die 14, an underfilling layer 16, and a mold compound component 18. In different applications, the semiconductor package 10 may include multiple flip chip dies. In detail, the flip chip die 14 includes a device layer 20, a number of interconnects 22 extending from a lower surface of the device layer 20 and coupled to an upper surface of the module substrate 12, and a silicon handle layer 24 over the device layer 20. As such, the backside of the silicon handle layer 24 is a top surface of the flip chip die 14.

In addition, the underfilling layer 16 resides over the upper surface of the module substrate 12, such that the underfilling layer 16 encapsulates the interconnects 22 and underfills the flip chip die 14 between the lower surface of the device layer 20 and the upper surface of the module substrate 12. The underfilling layer 16 may be formed from conventional polymeric compounds, which serve to mitigate the stress effects caused by Coefficient of Thermal Expansion (CTE) mismatch between the flip chip die 14 and the module substrate 12.

The mold compound component 18 resides over the underfilling layer 16 and encapsulates at least the sides of the device layer 20 and the sides of the silicon handle layer 24. The mold compound component 18 may be used as an etchant barrier to protect the flip chip die 14 against etchant chemistries such as Tetramethylammonium hydroxide (TMAH), potassium hydroxide (KOH), sodium hydroxide (NaOH), and acetylcholine (ACH) in the following steps. The mold compound component 18 may be formed from a same or different material as the underfilling layer 16. When the first mold compound 18 and the underfilling layer 16 are formed from a same material, the first mold compound 18 and the underfilling layer 16 may be formed simultaneously. One exemplary material used to form the mold compound component 18 is an organic epoxy resin system.

Next, the mold compound component 18 is thinned down to expose the backside of the silicon handle layer 24 of the flip chip die 14, as shown in FIG. 1B. The thinning procedure may be done with a mechanical grinding process. The following step is to remove substantially the entire silicon handle layer 24 of the flip chip die 14 to create a cavity 26 and provide the thinned flip chip die 14T with an upper surface exposed to the cavity 26, as shown in FIG. 1C. Herein, removing substantially the entire silicon handle layer 24 refers to removing at least 95% of the entire silicon handle layer 24, and perhaps a portion of the device layer 20. As such, in some applications, there is a thin layer of the substrate handle layer 24 (no more than 2 μm) left at the bottom of the cavity 26 (not shown). For other cases, the substrate handle layer 24 is removed completely and the device layer 20 is exposed at the bottom of the cavity 26. Removing substantially the entire silicon handle layer 24 may be provided by an etching process with a wet/dry etchant chemistry, which may be TMAH, KOH, ACH, NaOH, or the like.

FIG. 1D shows a step for filling the cavity 26 with a thermal conductive material 28. The thermal conductive material 28 may further reside over the mold compound component 18. The thermal conductive material 28 may be applied by various procedures, such as sheet molding, overmolding, compression molding, transfer molding, dam fill encapsulation, and screen print encapsulation. The thermal conductive material 28 may be a non-silicon high thermal conductivity mold compound with a thermal conductivity greater than 1 w/m·k or greater than 2.5 w/m·k, such as Hitachi Chemical Electronic Materials GE-506HT. A curing process (not shown) is followed to harden the thermal conductive material 28 in order to form a thermal conductive component 28C. The curing temperature is between 100° C. and 320° C. depending on which material is used as the thermal conductive material 28.

Finally, an upper surface of the thermal conductive component 28C is planarized to form a thermally enhanced semiconductor package 30 as depicted in FIG. 1E. A mechanical grinding process may be used for planarization. The upper portion of the thermal conductive component 28C may reside over the mold compound component 18.

FIG. 2 provides an exemplary FET 32 residing in the device layer 20 within a dashed section S1 of FIG. 1E. In different applications, there may be multiple FETs residing in the device layer 20. For clear illustrations, the exemplary FET 32 is shown upside down in FIG. 2. The FET 32 includes a first buried oxide (BOX) layer 34 over the thermal conductive component 28C, a first epitaxial layer 36 over the first BOX layer 34, a second BOX layer 38 over the first epitaxial layer 36, a second epitaxial layer 40 over the second BOX layer 38, a gate dielectric 42 over the second epitaxial layer 40, and a front-gate structure 44 formed over the gate dielectric 42. The front-gate structure 44 is separated from the second epitaxial layer 40 by the gate dielectric 42. Herein, the first BOX layer 34 may be formed from silicon oxide with a thickness between 5 nm and 2000 nm, or between 200 nm and 400 nm. The second BOX layer 38 may be formed from silicon oxide with a thickness between 5 nm and 2000 nm, or between 200 nm and 400 nm. The first epitaxial layer 36 has a thickness between 100 Å and 2 μm and the second epitaxial layer 40 has a thickness between 100 Å and 2 μm. Notice that, the first BOX layer 34 resides at the bottom boundary of the device layer 20 and has selective etching stop characteristics with respect to etchant chemistries (TMAH, KOH, NaOH, or ACH) for silicon. Therefore, when the silicon handle layer 24 is removed substantially with the etchant chemistries (TMAH, KOH, NaOH, or ACH) in the etching step as shown in FIG. 1C, the first BOX layer 34 provides an etchant barrier for the device layer 20.

In detail, the first epitaxial layer 36 includes a back-gate structure 46 and first isolation regions 48 surrounding the back-gate structure 46. The back-gate structure 46 has a back-gate region 50 and a back-gate extension 52 extending from the back-gate region 50 to one of the first isolation regions 48. The second BOX layer 38 is directly over the back-gate region 50. In addition, the second epitaxial layer 40 has a source 54, a drain 56, a channel 58, and second isolation regions 60. The channel 58 is formed directly over the second BOX layer 38. The source 54 is formed over the second BOX layer 38 and in contact with a first side of the channel 58. The drain 56 is formed over the second BOX layer 38 and in contact with a second side of the channel 58. The channel 58 separates the source 54 and the drain 56. The second isolation regions 60 surround the source 54 and the drain 56. Herein, the gate dielectric 42 and the front-gate structure 44 are aligned over the channel 58, and the back-gate region 50 is aligned below the channel 58. The first isolation regions 48 and the second isolation regions 60 may be formed by shallow trench isolation (STI).

The source 54, the drain 56, the channel 58, the gate dielectric 42, and the front-gate structure 44 are used to achieve a front-gate switch function of the exemplary FET 32. The source 54, the drain 56, the channel 58, the second BOX layer 38, and the back-gate structure 46 are used to achieve a back-gate switch function of the FET 32. Consequently, the FET 32 formed by the front-gate structure 44, the gate dielectric 42, the source 54, the drain 56, the channel 58, the second BOX layer 38, and the back-gate structure 46 is able to implement both front-gate switch function and back-gate switch function. Because of the first isolation regions 48, the FET 32 may have independent back-gate bias voltage from other FETs (not shown) residing in the device layer 20.

In addition, the FET 32 may also include a source contact 62 in contact with the source 54, a drain contact 64 in contact with the drain 56, a front-gate contact 66 in contact with the front-gate structure 44, and a front-side back-gate contact 68 coupled to the back-gate structure 46 via a front-side interconnect 70. The source contact 62, the drain contact 64, the front-gate contact 66, and the front-side back-gate contact 68 are over the second epitaxial layer 40 and facing the same direction. The front-side interconnect 70 extends through the second BOX layer 38 and one of the second isolation regions 60 of the second epitaxial layer 40 to connect the back-gate structure 46 to the front-side back-gate contact 68. In this embodiment, the front-side interconnect 70 is in contact with the back-gate extension 52 of the back-gate structure 46, and the one of the second isolation regions 60 penetrated by the front-side interconnect 70 is adjacent to the drain 56 or the source 54 (not shown). The front-side interconnect 70 may be formed from polysilicon or a metal material, such as tungsten or aluminum. For simplification, other necessary elements of the FET 32 such as Field Oxide, Gate Spacers, and Metal layers are not depicted.

According to another embodiment, the FET 32 has a back-side back-gate contact 72 instead of the front-side back-gate contact 68 as shown in FIG. 3. The source contact 62, the drain contact 64, and the front-gate contact 66 are over the second epitaxial layer 40 and facing a first direction; and the back-side back-gate contact 72 is below the first BOX layer 34 and facing a second direction, which is opposite the first direction. The back-side back-gate contact 72 is coupled to the back-gate structure 46 via a back-side interconnect 74, which may be formed from a low temperature deposition metal, like aluminum. The back-side interconnect 74 is formed by a backside process where an opening is selectively formed in the polymer material in 28C by using a laser ablation method, and a via metallization step. The back-side interconnect 74 extends through the first BOX layer 34 and at least a portion of the thermal conductive component 28C to connect the back-gate extension 52 to the back-side back-gate contact 72. The back-side back-gate contact 72 and the back-side interconnect 74 may be formed after the formation of the thermal conductive component 28C shown in FIG. 1E.

In some cases, the back-side interconnect 74 extends through the first BOX layer 34 and at least a portion of the thermal conductive component 28C, and connects the back-gate region 50 (not shown) instead of the back-gate extension 52 to the back-side back-gate contact 72. The actual locations of the back-side back-gate contact 72 and the back-side interconnect 74 vary in different applications. Typically, the further the back-side back-gate contact 72 is away from the back-gate region 50, the higher the possibility that the back-gate region 50 is influenced by other external terminals. Notice that, if the back-side interconnect 74 directly connects the back-gate region 50, the back-gate structure 46 may not include the back-gate extension 52.

In some cases, the FET 32 does not include either the front-side back-gate contact 68 or the back-side back-gate contact 72 (not shown). The back-gate structure 46 may be left floating and it may impact the FET 32 operation mainly through the static work-function. The floating back-gate structure 46 may help deplete the channel 58 and thus allow for better control.

FIGS. 4A-4E provide exemplary steps that illustrate a process to fabricate an alternative thermally enhanced semiconductor package. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 4A-4E.

Initially, an alternative semiconductor package 10A is provided as depicted in FIG. 4A. For the purpose of this illustration, the semiconductor package 10A includes the module substrate 12, an alternative flip chip die 14A, the underfilling layer 16, and the mold compound component 18. In different applications, the semiconductor package 10A may include multiple flip chip dies. In detail, the flip chip die 14A includes an alternative device layer 20A, the interconnects 22 extending from a lower surface of the device layer 20A and coupled to the upper surface of the module substrate 12, and an alternative silicon handle layer 24A over the device layer 20A. As such, the backside of the silicon handle layer 24 is a top surface of the flip chip die 14A. The silicon handle layer 24A includes a first silicon layer 76 directly over the device layer 20A and a second silicon layer 78 over the first silicon layer 76. The first silicon layer 76 is at least 0.001% of the silicon handle layer 24A and has a thickness between 10 nm and 10000 nm. The first silicon layer 76 has a different polarity from the second silicon layer 78. If the second silicon layer 78 has an N-type polarity, the first silicon layer 76 will have a P-type polarity and there will be a P-N junction formed between the first silicon layer 76 and the second silicon layer 78. In some applications, the second silicon layer 78 may have a P-type polarity, and the first silicon layer 76 will have an N-type polarity. There is still a P-N junction formed between the first silicon layer 76 and the second silicon layer 78. Herein, the different polarities within the silicon handle layer 24A may be formed by an implanting process.

In addition, the underfilling layer 16 resides over the upper surface of the module substrate 12, such that the underfilling layer 16 encapsulates the interconnects 22 and underfills the flip chip die 14A between the lower surface of the device layer 20A and the upper surface of the module substrate 12. The underfilling layer 16 may be formed from conventional polymeric compounds, which serve to mitigate the stress effects caused by CTE mismatch between the flip chip die 14A and the module substrate 12.

The mold compound component 18 resides over the underfilling layer 16 and encapsulates at least the sides of the device layer 20A and the sides of the silicon handle layer 24A. The mold compound component 18 may be used as an etchant barrier to protect the flip chip die 14A against etchant chemistries such as TMAH, KOH, NaOH, and ACH in the following etching step. The mold compound component 18 may be formed from a same or different material as the underfilling layer 16. When the first mold compound 18 and the underfilling layer 16 are formed from a same material, the first mold compound 18 and the underfilling layer 16 may be formed simultaneously. One exemplary material used to form the mold compound component 18 is an organic epoxy resin system.

Next, the mold compound component 18 is thinned down to expose the backside of the silicon handle layer 24A of the flip chip die 14A, as shown in FIG. 4B. The thinning procedure may be done with a mechanical grinding process. The following step is to remove the second silicon layer 78 of the silicon handle layer 24A to create a cavity 26A and provide a thinned flip chip die 14AT with an upper surface exposed to the cavity 26A, as shown in FIG. 4C. Removing the second silicon layer 78 of the silicon handle layer 24A may be provided by an etching process with a wet/dry etchant chemistry, which may be TMAH, KOH, ACH, NaOH, or the like. Since the P-N junction formed between the second silicon layer 78 and the first silicon layer 76 has selective etching stop characteristics with respect to etchant chemistries (TMAH, KOH, NaOH, or ACH) for single-polarity silicon, the etching process with these etchant chemistries will stop at the P-N junction. In some applications, there may be a thin layer of the second silicon layer 78 (less than 5%) left at the bottom of the cavity 26A (not shown). For other cases, the second silicon layer 78 is removed completely and the first silicon layer 76 is exposed at the bottom of the cavity 26A.

FIG. 4D shows a step for filling the cavity 26A with the thermal conductive material 28. The thermal conductive material 28 may further reside over the mold compound component 18. The thermal conductive material 28 may be applied by various procedures, such as sheet molding, overmolding, compression molding, transfer molding, dam fill encapsulation, and screen print encapsulation. The thermal conductive material 28 may be a non-silicon high thermal conductivity mold compound with a thermal conductivity greater than 1 w/m·k or greater than 2.5 w/m·k, such as Hitachi Chemical Electronic Materials GE-506HT. A curing process (not shown) is followed to harden the thermal conductive material 28 in order to form a thermal conductive component 28C. The curing temperature is between 100° C. and 320° C. depending on which material is used as the thermal conductive material 28.

Finally, an upper surface of the thermal conductive component 28C is planarized to form an alternative thermally enhanced semiconductor package 30A as depicted in FIG. 4E. A mechanical grinding process may be used for planarization. The upper portion of the thermal conductive component 28C may reside over the mold compound component 18.

FIG. 5 provides an exemplary FET 80 included in the alternative thermally enhanced semiconductor package 30A within a dashed section SII of FIG. 4E. In different applications, there may be multiple FETs residing in the thermally enhanced semiconductor package 30A. For clear illustrations, the exemplary FET 80 is shown upside down in FIG. 5. The FET 80 includes the first silicon layer 76 over the thermal conductive component 28C, a BOX layer 82 over the first silicon layer 76, an epitaxial layer 84 over the BOX layer 82, a gate dielectric 86 over the epitaxial layer 84, and a front-gate structure 88 formed over the gate dielectric 86. The front-gate structure 88 is separated from the epitaxial layer 84 by the gate dielectric 86. Herein, the BOX layer 82 is formed from silicon oxide with a thickness between 5 nm and 2000 nm, or between 200 nm and 400 nm. The epitaxial layer 84 has a thickness between 100 Å and 2 μm.

In detail, the first silicon layer 76 includes a back-gate structure 90, which has a back-gate region 92 and back-gate extensions 94. The back-gate region 92 is surrounded by the back-gate extensions 94 and may have a higher implant density than the back-gate extensions 94. The BOX layer 82 is directly over the back-gate region 92. In addition, the epitaxial layer 84 has a source 96, a drain 98, a channel 100, and epitaxial isolation regions 102. The channel 100 is formed directly over the BOX layer 82. The source 96 is formed over the BOX layer 82 and in contact with a first side of the channel 100. The drain 98 is formed over the BOX layer 82 and in contact with a second side of the channel 100. The channel 100 separates the source 96 and the drain 98. The epitaxial isolation regions 102 surround the source 96 and the drain 98. Herein, the back-gate region 92 is aligned below the channel 100. The gate dielectric 86 and the front-gate structure 88 are aligned over the channel 100. The epitaxial isolation regions 102 may be formed by STI.

The source 96, the drain 98, the channel 100, the gate dielectric 86, and the front-gate structure 88 are used to achieve a front-gate switch function of the exemplary FET 80. The source 96, the drain 98, the channel 100, the BOX layer 82, and the back-gate structure 90 are used to achieve a back-gate switch function of the FET 80. Consequently, the FET 80 formed by the front-gate structure 88, the gate dielectric 86, the source 96, the drain 98, the channel 100, the BOX layer 82, and the back-gate structure 90 is able to implement both front-gate switch function and back-gate switch function.

In addition, the FET 80 may also include a source contact 104 in contact with the source 96, a drain contact 106 in contact with the drain 98, a front-gate contact 108 in contact with the front-gate structure 88, and a front-side back-gate contact 110 coupled to the back-gate structure 90 via a front-side interconnect 112. The source contact 104, the drain contact 106, the front-gate contact 108, and the front-side back-gate contact 110 are over the epitaxial layer 84 and facing the same direction. The front-side interconnect 112 extends through the BOX layer 82 and one of the epitaxial isolation regions 102 of the epitaxial layer 84 to connect the back-gate structure 90 to the front-side back-gate contact 110. In this embodiment, the front-side interconnect 112 is in contact with one of the back-gate extensions 94, and the one of the epitaxial isolation regions 102 penetrated by the front-side interconnect 112 is adjacent to the drain 98 or the source 96 (not shown). The front-side interconnect 112 may be formed from polysilicon or a metal material, such as tungsten or aluminum. For simplification, other necessary elements of the FET 32 such as Field Oxide, Gate Spacers, and Metal layers are not depicted.

In order to provide individual per-FET back-gate manipulation, the first silicon layer 76 may also include back-gate isolation regions 114 as shown in FIG. 6. The back-gate isolation regions 114 extend through the first silicon layer 76 and surround the back-gate structure 90. The back-gate isolation regions 114 separate the back-gate structure 90 for the FET 80 from back-gate structures for other FETs (not shown).

According to another embodiment, the FET 80 has a back-side back-gate contact 116 instead of the front-side back-gate contact 110 as shown in FIG. 7. The back-side back-gate contact 116 is coupled to the back-gate structure 90 via a back-side interconnect 118, which may be formed from a low temperature deposition metal, like aluminum. The back-side interconnect 118 is formed by a backside process where an opening is selectively formed in the polymer material in 28C by using a laser ablation method, and a via metallization step. The back-side interconnect 118 extends through at least a portion of the thermal conductive component 28C and connects to one of the back-gate extensions 94. The back-side back-gate contact 116 and the back-side interconnect 118 may be formed after the formation of the thermal conductive component 28C shown in FIG. 4E.

In some cases, the back-side interconnect 118 extends through at least a portion of the thermal conductive component 28C and connects the back-gate region 92 instead of one of the back-gate extensions 94 (not shown). The actual location of the back-side back-gate contact 116 and the back-side interconnect 118 varies in different applications. Typically, the further the back-side back-gate contact 116 is away from the back-gate region 92, the higher the possibility that the back-gate region 92 is influenced by other external terminals.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
    a thermal conductive component with no silicon;
    a silicon layer over the thermal conductive component, wherein the silicon layer has a thickness between 100 Å and 10 μm;
    a buried oxide (BOX) layer over the silicon layer;
    an epitaxial layer over the BOX layer and having a source, a drain, a channel between the source and the drain, and epitaxial isolation regions surrounding the source and the drain;
    a gate dielectric aligned over the channel;
    a front-gate structure over the gate dielectric, wherein:
        a back-gate structure is formed in the silicon layer and has a back-gate region aligned below the channel; and
        a field effect transistor (FET) is formed by the front-gate structure, the source, the drain, the channel, and the back-gate structure; and
    a front-side back-gate contact coupled to the back-gate structure via a front-side interconnect, which extends through the BOX layer and one of the epitaxial isolation regions of the epitaxial layer, wherein the one of the epitaxial isolation regions is adjacent to the drain or the source.

2. The apparatus of claim 1 wherein the epitaxial isolation regions are formed by shallow trench isolation (STI).

3. The apparatus of claim 1 wherein:
    the back-gate structure further comprises back-gate extensions that surround the back-gate region; and
    the front-side interconnect is in contact with one of the back-gate extensions.

4. The apparatus of claim 3 wherein the back-gate region has a higher implant density than the back-gate extensions.

5. The apparatus of claim 1 wherein the front-side interconnect is formed from polysilicon.

6. The apparatus of claim 1 wherein the silicon layer further comprises back-gate isolation regions, which surround the back-gate structure.

7. The apparatus of claim 6 wherein the back-gate isolation regions are formed by shallow trench isolation (STI).

8. The apparatus of claim 6 wherein:
the back-gate structure further comprises back-gate extensions that surround the back-gate region;
the back-gate isolation regions surround the back-gate extensions; and
the front-side interconnect is in contact with one of the back-gate extensions.

9. The apparatus of claim 8 wherein the back-gate region has a higher implant density than the back-gate extensions.

10. The apparatus of claim 1 further comprising a source contact directly over the source, a drain contact directly over the drain, and a front-gate contact directly over the front-gate structure.

11. The apparatus of claim 1 wherein the thermal conductive component has a thermal conductivity greater than 1 w/m·k.

12. The apparatus of claim 1 wherein the thermal conductive component has a thermal conductivity greater than 2.5 w/m·k.

13. An apparatus comprising:
a thermal conductive component with no silicon;
a silicon layer over the thermal conductive component, wherein the silicon layer has a thickness between 100 Å and 10 μm;
a buried oxide (BOX) layer over the silicon layer;
an epitaxial layer over the BOX layer and having a source, a drain, and a channel between the source and the drain;
a gate dielectric aligned over the channel;
a front-gate structure over the gate dielectric, wherein:
a back-gate structure is formed in the silicon layer and has a back-gate region aligned below the channel; and
a field effect transistor (FET) is formed by the front-gate structure, the source, the drain, the channel, and the back-gate structure; and
a back-side back-gate contact coupled to the back-gate structure via a back-side interconnect, which extends through the thermal conductive component.

14. The apparatus of claim 13 wherein:
the back-gate structure further comprises back-gate extensions that surround the back-gate region; and
the back-side interconnect is in contact with one of the back-gate extensions.

15. The apparatus of claim 13 wherein the back-side interconnect is in contact with the back-gate region.

16. The apparatus of claim 13 wherein the back-side interconnect is formed from polysilicon.

17. The apparatus of claim 1 wherein the BOX layer has a thickness between 5 nm-2000 nm.

18. The apparatus of claim 1 wherein the BOX layer has a thickness between 200 nm-400 nm.

19. The apparatus of claim 1 wherein the epitaxial layer has a thickness between 100 Å and 2 μm.

20. An apparatus comprising:
a thermal conductive component with no silicon;
a silicon layer over the thermal conductive component, wherein the silicon layer has a thickness between 100 Å and 10 μm;
a device layer over the silicon layer comprising:
a buried oxide (BOX) layer over the silicon layer;
an epitaxial layer over the BOX layer and having a source, a drain, and a channel between the source and the drain;
a gate dielectric aligned over the channel;
a front-gate structure over the gate dielectric, wherein:
a back-gate structure is formed in the silicon layer and has a back-gate region aligned below the channel; and
a field effect transistor (FET) is formed by the front-gate structure, the source, the drain, the channel, and the back-gate structure; and
a mold compound component surrounding the device layer and the silicon layer, and extending beyond the silicon layer to form a cavity within the mold compound component, wherein the thermal conductive component fills the cavity and is in contact with the silicon layer.

* * * * *